United States Patent
Kajiwara et al.

(10) Patent No.: US 12,550,396 B2
(45) Date of Patent: Feb. 10, 2026

(54) SEMICONDUCTOR DEVICE

(71) Applicant: KABUSHIKI KAISHA TOSHIBA, Tokyo (JP)

(72) Inventors: Yosuke Kajiwara, Yokohama Kanagawa (JP); Aya Shindome, Yokohama Kanagawa (JP); Masahiko Kuraguchi, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 400 days.

(21) Appl. No.: 18/172,824

(22) Filed: Feb. 22, 2023

(65) Prior Publication Data
US 2024/0038849 A1 Feb. 1, 2024

(30) Foreign Application Priority Data

Jul. 29, 2022 (JP) ................................. 2022-121289
Feb. 2, 2023 (JP) ................................. 2023-014346

(51) Int. Cl.
*H01L 29/205* (2006.01)
*H01L 21/02* (2006.01)
(Continued)

(52) U.S. Cl.
CPC ......... *H10D 62/824* (2025.01); *H10D 30/015* (2025.01); *H10D 30/475* (2025.01);
(Continued)

(58) Field of Classification Search
CPC .. H10D 30/475; H10D 62/124; H10D 62/824; H10D 62/8503; H10D 64/66
See application file for complete search history.

(56) References Cited

U.S. PATENT DOCUMENTS 9,508,822 B2  11/2016  Oka et al.
10,109,727 B2  10/2018  Oyama et al.
(Continued)

FOREIGN PATENT DOCUMENTS

JP  2009-99774 A  5/2009
JP  2010-74077 A  4/2010
(Continued)

OTHER PUBLICATIONS

Japan Patent Office, Notice of Reasons for Refusal, Japanese Pat. App. No. 2023-014346, Nov. 25, 2025, all pages. (Year: 2025).*

(Continued)

*Primary Examiner* — Victoria K. Hall
(74) *Attorney, Agent, or Firm* — Finnegan, Henderson, Farabow, Garrett & Dunner, LLP

(57) ABSTRACT

According to one embodiment, a semiconductor device includes a first electrode, a second electrode, a third electrode, a first nitride region, a second nitride region, and a third nitride region. The first nitride region includes $Al_{x1}Ga_{1-x1}N$ ($0 \leq x1 < 1$). The first nitride region includes a first partial region, a second partial region, a third partial region, a fourth partial region, and a fifth partial region. The second nitride region includes $Al_{x2}Ga_{1-x2}N$ ($x1 < x2 \leq 1$) or $In_y Al_z Ga_{(1-y-z)}N$ ($0 < y \leq 1$, $0 \leq z < 1$, $y+z \leq 1$). The second nitride region includes a sixth partial region. The third nitride region includes $Al_{x3}Ga_{1-x3}N$ ($x1 < x3 < x2$). The third nitride region includes a seventh partial region.

13 Claims, 10 Drawing Sheets

(51) Int. Cl.
*H01L 29/20* (2006.01)
*H01L 29/423* (2006.01)
*H10D 30/01* (2025.01)
*H10D 30/47* (2025.01)
*H10D 62/10* (2025.01)
*H10D 62/824* (2025.01)
*H10D 62/85* (2025.01)
*H10D 64/23* (2025.01)
*H10D 64/27* (2025.01)
*H10D 64/64* (2025.01)
*H10D 64/66* (2025.01)
*H10P 14/20* (2026.01)
*H10P 14/692* (2026.01)

(52) U.S. Cl.
CPC ......... *H10D 62/117* (2025.01); *H10D 62/124* (2025.01); *H10D 62/8503* (2025.01); *H10D 64/256* (2025.01); *H10D 64/516* (2025.01); *H10D 64/647* (2025.01); *H10D 64/66* (2025.01); *H10P 14/3416* (2026.01); *H10P 14/69215* (2026.01); *H10P 14/69391* (2026.01); *H10P 14/3216* (2026.01); *H10P 14/3248* (2026.01)

(56) References Cited

U.S. PATENT DOCUMENTS

| | | | |
|---|---|---|---|
| 10,483,354 B2 | 11/2019 | Uesugi et al. | |
| 2011/0089468 A1* | 4/2011 | Zhang | H10D 64/513 257/E29.246 |
| 2014/0264450 A1* | 9/2014 | Chyi | H10D 30/015 257/194 |
| 2019/0088770 A1 | 3/2019 | Tajima et al. | |
| 2019/0214495 A1 | 7/2019 | Tajima et al. | |
| 2019/0280110 A1 | 9/2019 | Ohki | |
| 2020/0006521 A1* | 1/2020 | Banerjee | H10D 62/149 |
| 2020/0105916 A1* | 4/2020 | Moens | H10D 62/117 |
| 2020/0105917 A1 | 4/2020 | Okita et al. | |
| 2021/0234031 A1 | 7/2021 | Makiyama et al. | |
| 2021/0242337 A1* | 8/2021 | Wang | H10D 62/824 |
| 2021/0376136 A1* | 12/2021 | Akutsu | H10D 64/254 |

FOREIGN PATENT DOCUMENTS

| | | |
|---|---|---|
| JP | 2014-192493 A | 10/2014 |
| JP | 2016-127089 A | 7/2016 |
| JP | 2019-134153 A | 8/2019 |
| JP | 2019-160966 A | 9/2019 |
| JP | 2020-53585 A | 4/2020 |
| JP | 2020-174202 A | 10/2020 |
| JP | 2021-118251 A | 8/2021 |
| JP | 2021-190501 A | 12/2021 |

OTHER PUBLICATIONS

Japan Patent Office, Office Action in JP App. No. 2023-014346 (Aug. 27, 2025).

* cited by examiner

US 12,550,396 B2

SEMICONDUCTOR DEVICE

CROSS-REFERENCE TO RELATED APPLICATIONS

This application is based upon and claims the benefit of priority from Japanese Patent Application No. 2022-121289, filed on Jul. 29, 2022, and Japanese Patent Application No. 2023-14346, filed on Feb. 2, 2023; the entire contents of which are incorporated herein by reference.

FIELD

Embodiments of described herein generally relate to a semiconductor device.

BACKGROUND

For example, in a semiconductor device such as a transistor, improvement in characteristics is desired

DETAILED DESCRIPTION

Figure 1:
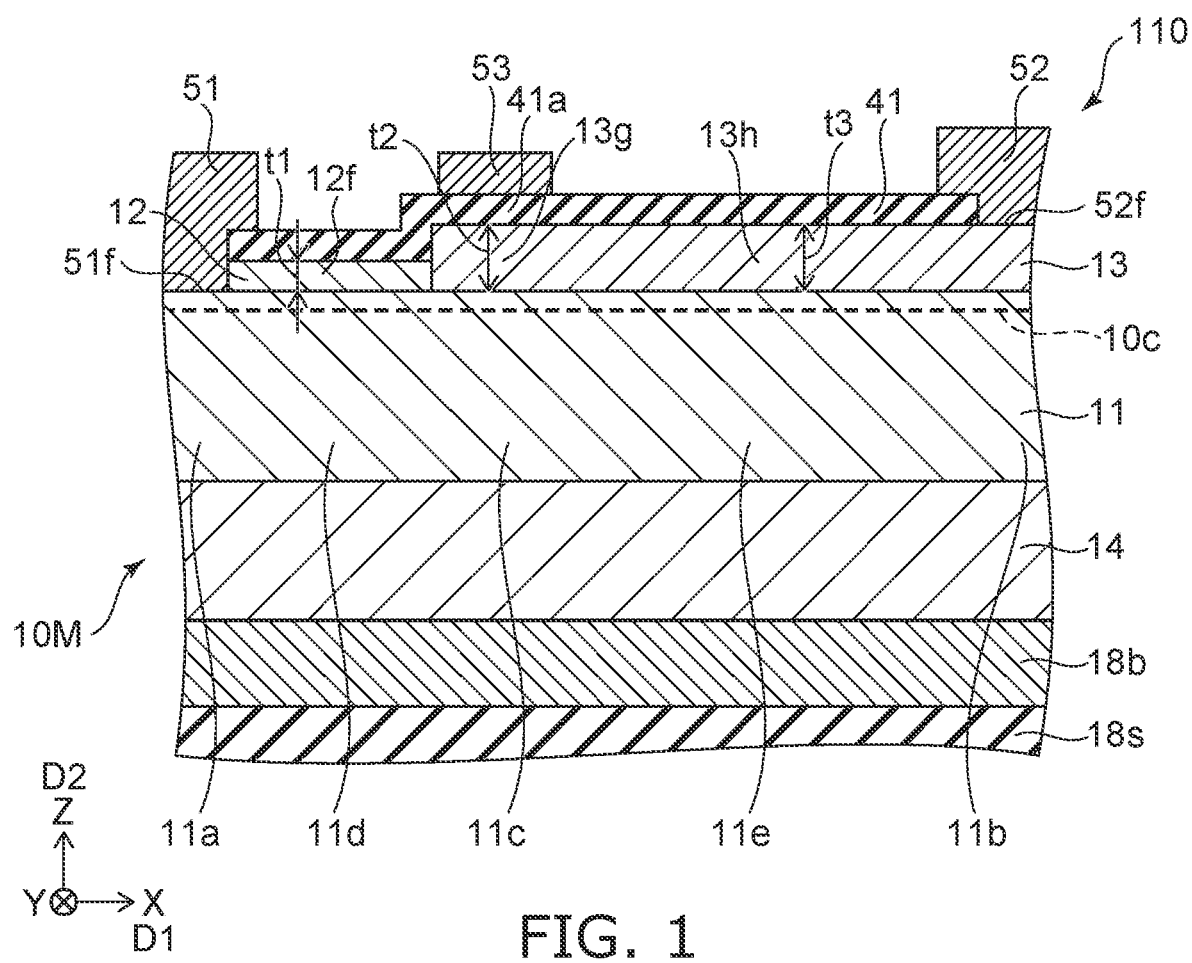
FIG. 1 is a schematic cross-sectional view illustrating a semiconductor device according to a first embodiment.

According to one embodiment, a semiconductor device includes a first electrode, a second electrode, a third electrode, a first nitride region, a second nitride region, and a third nitride region. A direction from the first electrode to the second electrode is along a first direction. A position of the third electrode in the first direction is between a position of the first electrode in the first direction and a position of the second electrode in the first direction. The first nitride region includes $Al_{x1}Ga_{1-x1}N$ ($0 \leq x1 < 1$). The first nitride region includes a first partial region, a second partial region, a third partial region, a fourth partial region, and a fifth partial region. A direction from the first partial region to the first electrode is along a second direction crossing the first direction. A direction from the second partial region to the second electrode is along the second direction. A direction from the third partial region to the third electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second nitride region includes $Al_{x2}Ga_{1-x2}N$ ($x1 < x2 \leq 1$) or $In_yAl_zGa_{(1-y-z)}N$ ($0 < y \leq 1$, $0 \leq z < 1$, $y+z \leq 1$). The second nitride region includes a sixth partial region. A direction from the fourth partial region to the sixth partial region is along the second direction. The third nitride region includes $Al_{x3}Ga_{1-x3}N$ ($x1 < x3 < x2$). The third nitride region includes a seventh partial region. The seventh partial region is located between the third partial region and the third electrode.

Embodiments of the present invention will now be described with reference to the drawings.

The drawings are schematic or conceptual, and the relationship between the thickness and width of the respective portions, the ratio of the sizes between the portions, and the like are not necessarily the same as the actual ones. Even when the same part is represented, the dimensions and proportions of each other may be represented differently depending on the drawings.

In the specification of the present application and each of the figures, elements similar to those described above with respect to the previously described figures are denoted by the same reference numerals and a detailed description thereof is omitted as appropriate.

First Embodiment

FIG. 1 is a schematic cross-sectional view illustrating a semiconductor device according to the first embodiment.

As shown in FIG. 1, a semiconductor device 110 includes a first electrode 51, a second electrode 52, a third electrode 53, a first nitride region 11, a second nitride region 12, and a third nitride region 13.

A direction from the first electrode 51 to the second electrode 52 is along a first direction D1. The first direction D1 is defined as an X-axis direction. One direction perpendicular to the X-axis direction is defined as a Z-axis direction. The direction perpendicular to the X-axis direction and the Z-axis direction is defined as a Y-axis direction.

A position of the third electrode 53 in the first direction D1 is between a position of the first electrode 51 in the first direction D1 and a position of the second electrode 52 in the first direction D1. In the first direction D1, at least a part of the third electrode 53 may be located between at least a part of the first electrode 51 and at least a part of the second electrode 52.

The first nitride region 11 includes $Al_{x1}Ga_{1-x1}N$ ($0 \leq x1 < 1$). The composition ratio x1 is, for example, not less than 0 and less than 0.1. The first nitride region 11 includes, for example, GaN.

The first nitride region 11 includes a first partial region 11a, a second partial region 11b, a third partial region 11c, a fourth partial region 11d, and a fifth partial region 11e. A direction from the first partial region 11a to the first electrode 51 is along a second direction D2. The second direction D2 crosses the first direction D1. The second direction D2 is, for example, the Z-axis direction.

A direction from the second partial region 11b to the second electrode 52 is along the second direction D2. A direction from the third partial region 11c to the third electrode 53 is along the second direction D2. For example, the region overlapping the first electrode 51 in the second direction D2 corresponds to the first partial region 11a. For example, the region overlapping the second electrode 52 in the second direction D2 corresponds to the second partial region 11b. For example, the region overlapping the third electrode 53 in the second direction D2 corresponds to the third partial region 11c.

A position of the fourth partial region 11d in the first direction D1 is between a position of the first partial region 11a in the first direction D1 and a position of the third partial region 11c in the first direction D1. A position of the fifth partial region 11e in the first direction D1 is between the position of the third partial region 11c in the first direction D1 and a position of the second partial region 11b in the first direction D1. The boundaries between these subregions may be unclear or clear.

The second nitride region 12 includes $Al_{x2}Ga_{1-x2}N$ ($x1<x2\leq 1$) or $In_yAl_zGa_{(1-y-z)}N$ ($0<y\leq 1$, $0\leq z<1$, $y+z\leq 1$). When the second nitride region 12 includes $Al_{x2}Ga_{1-x2}N$ ($x1<x2\leq 1$), the composition ratio x2 of Al is, for example, not less than 0.8 and not more than 1. In one example, the second nitride region 12 may include AlN. Alternatively, the second nitride region 12 may include InAlGaN. An example in which the second nitride region 12 includes $Al_{x2}Ga_{1-x2}N$ ($x1<x2\leq 1$) will be described below. The second nitride region 12 includes a crystal. As will be described later, a part of the second nitride region 12 may be amorphous.

The second nitride region 12 includes a sixth partial region 12f. A direction from the fourth partial region 11d to the sixth partial region 12f is along the second direction D2.

The third nitride region 13 includes $Al_{x3}Ga_{1-x3}N$ ($x1<x3<x2$). The composition ratio x3 of Al in the third nitride region 13 is, for example, not less than 0.1 and not more than 0.35. The third nitride region 13 includes a crystal.

The third nitride region 13 includes a seventh partial region 13g. The seventh partial region 13g is located between the third partial region 11c and the third electrode 53.

In the example shown in FIG. 1, the semiconductor device 110 includes a first insulating member 41. The first insulating member 41 includes a first insulating region 41a. The first insulating region 41a is located between the third partial region 11c and the third electrode 53.

A current flowing between the first electrode 51 and the second electrode 52 can be controlled by a potential of the third electrode 53. The potential of the third electrode 53 may be, for example, a potential based on a potential of the first electrode 51. The first electrode 51 functions as a source electrode, for example. The second electrode 52 functions as a drain electrode, for example. The third electrode 53 functions as a gate electrode. The semiconductor device 110 is, for example, a transistor.

The first nitride region 11 includes a region facing the second nitride region 12 and a region facing the third nitride region 13. For example, a carrier region 10c is formed in these facing regions. The carrier region 10c is, for example, a two-dimensional electron gas. The semiconductor device is, for example, a HEMT (High Electron Mobility Transistor).

A distance between the first electrode 51 and the third electrode 53 along the first direction D1 is shorter than a distance between the third electrode 53 and the second electrode 52 along the first direction D1. For example, a high voltage is applied to the second electrode 52. By the distance between the third electrode 53 and the second electrode 52 along the first direction D1 is long, stable characteristics can be easily obtained, for example. Destruction etc. can be suppressed.

In an embodiment, a high Al composition ratio is applied to the sixth partial region 12f (the second nitride region 12). As a result, a high carrier concentration is obtained in a portion corresponding to the sixth partial region 12f. Thereby, a low sheet resistance is obtained. For example, a low on-resistance is obtained.

On the other hand, a low Al composition ratio is applied to the seventh partial region 13g. By the Al composition ratio is low, a high crystal quality is easily obtained in the seventh partial region 13g. Thereby, for example, high gate reliability can easily be obtained. Gate leakage current can be reduced.

In an operation of the semiconductor device 110, the electric field strength applied between the first electrode 51 and the third electrode 53 is relatively low. Therefore, the crystal quality is not necessarily high in the sixth partial region 12f (the second nitride region 12) to which the high Al composition ratio is applied. Since the electric field strength is low, practically sufficient stable characteristics can be obtained even in low crystal quality. As described above, when a high Al composition ratio is applied to the sixth partial region 12f, a high carrier concentration is obtained, which results in a low on-resistance.

In the embodiment, by applying the high Al composition ratio to the sixth partial region 12f, a low on-resistance can be obtained. On the other hand, by applying the low Al composition ratio to the seventh partial region 13g, the high gate reliability can be obtained. According to the embodiment, a semiconductor device capable of improving characteristics can be provided. According to embodiments, high reliability can be maintained.

As shown in FIG. 1, the sixth partial region 12f has a first thickness t1 along the second direction D2. The seventh partial region 13g has a second thickness t2 along the second direction D2. In the embodiment, the first thickness t1 is preferably thinner than the second thickness t2. When the Al composition ratio is high and the thickness is thick, the crystal quality tends to deteriorate drastically. For example, crystals tend to crack. For example, the gate leakage current tends to increase. By the first thickness t1 of the sixth partial region 12f having the high Al composition ratio is thin, high crystal quality can be maintained.

When the second nitride region 12 includes $In_yAl_zGa_{(1-y-z)}N$ ($0<y\leq 1$, $0\leq z<1$, $y+z\leq 1$), a high carrier concentration is also obtained in the portion corresponding to the sixth partial region 12f. Thereby, the low sheet resistance is obtained. For example, the low on-resistance is obtained. The composition ratio y of In is preferably not less than 0 and less than 0.2, for example. The composition ratio z of Al is preferably not less than 0.8 and less than 1.

For example, the first thickness t1 is preferably 0.5 times or less of the second thickness t2. For example, the first thickness t1 is preferably not less than 1 nm and not more than 10 nm. For example, the second thickness t2 is preferably not less than 20 nm and not more than 40 nm. A practical nitride region having high crystal quality is obtained.

As shown in FIG. 1, the third nitride region 13 may further include an eighth partial region 13h. A direction from the fifth partial region 11e to the eighth partial region 13h is along the second direction D2. In the operation of the semiconductor device 110, the high voltage is applied to the second electrode 52. The potential difference between the third electrode 53 and the second electrode 52 is large. In the region between the third electrode 53 and the second electrode 52, the third nitride region 13 (the eighth partial region 13h) having a low Al composition ratio and easy to obtain high crystal quality is provided. Thereby, high operation stability can be easily obtained. For example, it is easy to obtain high reliability. The breakdown voltage of the semiconductor device is improved.

As shown in FIG. 1, the eighth partial region 13h has a third thickness t3 along the second direction D2. The first thickness t1 is thinner than the third thickness t3. The third thickness t3 may be substantially the same as the second thickness t2.

The first electrode 51 is electrically connected to at least one of the first partial region 11a or the sixth partial region 12f. The second electrode 52 is electrically connected to at least one of the second partial region 11b or the eighth partial region 13h.

As shown in FIG. 1, the sixth partial region 12f may be located between the fourth partial region 11d and a part of the first insulating member 41. For example, the part of the first insulating member 41 may be provided on the sixth partial region 12f. The part of the first insulating member 41 functions as a protective film, for example. For example, the sixth partial region 12f is stabilized. The part of the first insulating member 41 functions as, for example, a gate insulating film. For example, a stable threshold voltage is obtained. For example, the gate leakage current can be reduced.

The first insulating member 41 may include, for example, at least one selected from the group consisting of SiN, $SiO_2$, SiON, AlN, AlON, AlSiON, and $Al_2O_3$.

As shown in FIG. 1, the first electrode 51 includes a first electrode face 51f. A direction from the first partial region 11a to the first electrode face 51f is along the second direction D2. For example, the first electrode face 51f faces the first partial region 11a. The second electrode 52 includes a second electrode face 52f. A direction from the second partial region 11b to the second electrode face 52f is along the second direction D2. For example, the second electrode face 52f faces the second partial region 11b. For example, the second electrode face 52f may face the third nitride region 13 (the eighth partial region 13h).

The height of the first electrode face 51f may be different from the height of the second electrode face 52f. A step may be provided in these electrodes. For example, a position of the first electrode face 51f in the second direction D2 may be different from a position of the second electrode face 52f in the second direction D2. The difference between these positions need not be excessively large.

For example, the distance in the second direction D2 between the position of the first electrode face 51f in the second direction D2 and the position of the second electrode face 52f in the second direction D2 is preferably 50 nm or less.

The semiconductor device 110 has, for example, a normally-on characteristic. The first electrode 51, the second electrode 52, and the third electrode 53 may extend along the Y-axis direction.

As shown in FIG. 1, the semiconductor device 110 may include a substrate 18s. The semiconductor device 110 may include a nitride layer 18b. The substrate 18s may include at least one selected from the group consisting of, for example, silicon, GaN and SiC. The nitride layer 18b is provided on a substrate 18s. The nitride layer 18b includes, for example, Al, Ga and N. The nitride layer 18b is, for example, a buffer layer. A semiconductor member 10M is provided on the buffer layer. The semiconductor member 10M includes a layer 14, the first nitride region 11 on the layer 14, the second nitride region 12, and the third nitride region 13. The semiconductor member 10M is formed by, for example, epitaxial growth.

In one example, the sixth partial region 12f is an AlN film having a thickness of 3 nm. In this case, the carrier concentration in the region between the first electrode 51 and the third electrode 53 is about $7 \times 10^{12}$ $cm^{-2}$. At this time, the sheet resistance in the region between the first electrode 51 and the third electrode 53 is 540 Ω/square.

On the other hand, in a reference example, the sixth partial region 12f is an $Al_{0.17}Ga_{0.83}N$ film having a thickness of 30 nm. In this case, the carrier concentration in the region between the first electrode 51 and the third electrode 53 is about $5.5 \times 10^{12}$ $cm^{-2}$. At this time, the sheet resistance in the region between the first electrode 51 and the third electrode 53 is 630 Ω/square.

Thus, by applying a high Al composition ratio to the sixth partial region 12f, a high carrier concentration can be obtained. Low sheet resistance is obtained.

Figure 2:
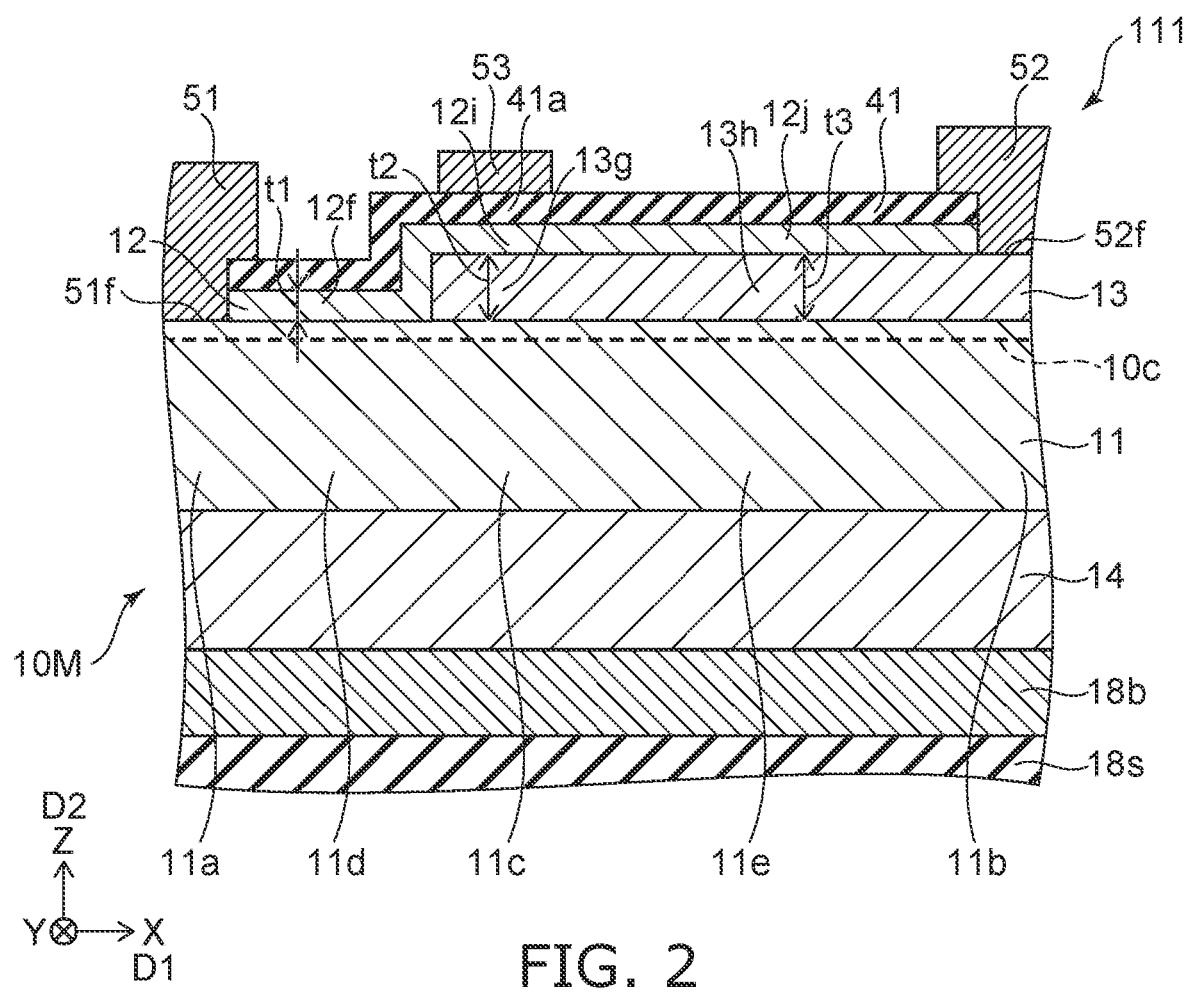
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, in a semiconductor device 111 according to the embodiment, the shape of the second nitride region 12 is different from the shape of the second nitride region 12 in the semiconductor device 110. Except for this, the configuration of the semiconductor device 111 may be the same as that of the semiconductor device 110.

In the semiconductor device 111, the second nitride region 12 further includes a ninth partial region 12i. The ninth partial region 12i is located between the seventh partial region 13g and the third electrode 53. The second nitride region 12 may further include a tenth partial region 12j. The eighth partial region 13h is located between the fifth partial region 11e and the tenth partial region 12j.

For example, the ninth partial region 12i is continuous with the sixth partial region 12f. For example, the tenth partial region 12j is continuous with the ninth partial region 12i. A uniform film is easily obtained in the second nitride region 12 having the continuous film-shape. In the second nitride region 12 having the continuous film shape, more stable characteristics are easily obtained.

Figure 3:
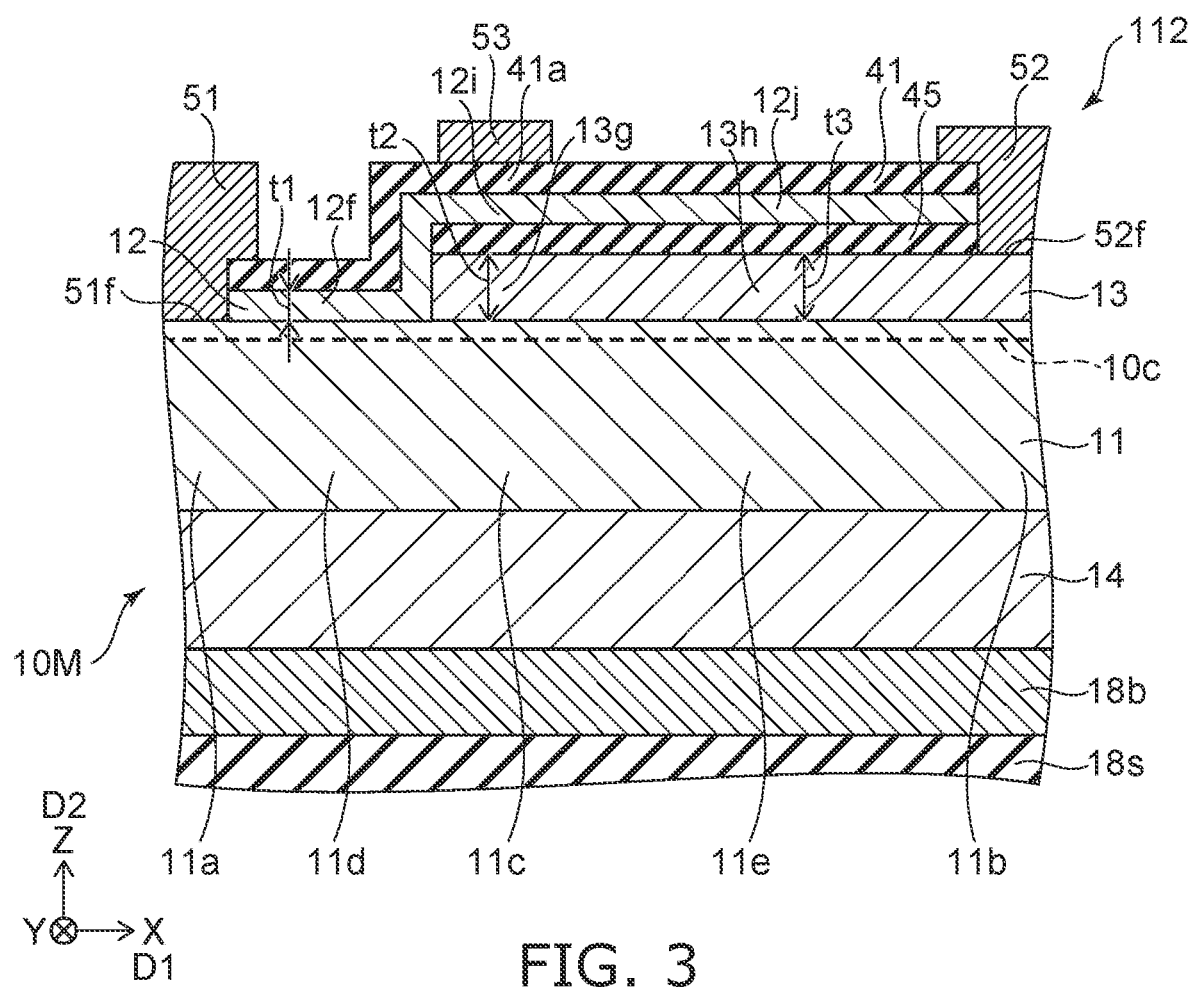
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, a semiconductor device 112 according to the embodiment further includes a first insulating layer 45. Except for this, the configuration of the semiconductor device 112 may be the same as that of the semiconductor device 111.

The first insulating layer 45 is located between the eighth partial region 13h and the tenth partial region 12j. The first insulating layer 45 functions as a protective film, for example. For example, the third nitride region 13 is protected by the first insulating layer 45. The first insulating layer 45 may include, for example, at least one selected from the group consisting of SiN, SiON, $SiO_2$, $Al_2O_3$, AlON, AlN, and AlSiON.

In the semiconductor device 112, the tenth partial region 12j may be amorphous. Alternatively, the crystallinity in the sixth partial region 12f is higher than the crystallinity in the tenth partial region 12j. The low crystallinity in the tenth partial region 12j suppresses, for example, leakage current. For example, it is easy to obtain a high breakdown voltage. More stable characteristics are easily obtained. The low crystallinity in the tenth partial region 12j makes it easy to suppress, for example, the entry of impurities (For example, water or hydrogen) into the nitride semiconductor layer from the outside.

In the semiconductor device 112, the ninth partial region 12i may be amorphous. Alternatively, the crystallinity in the sixth partial region 12f is higher than the crystallinity in the ninth partial region 12*i*. The low crystallinity in the ninth partial region 12*i* suppresses, for example, the leakage current. For example, it is easy to obtain a high breakdown voltage. More stable characteristics are easily obtained.

Figure 4:
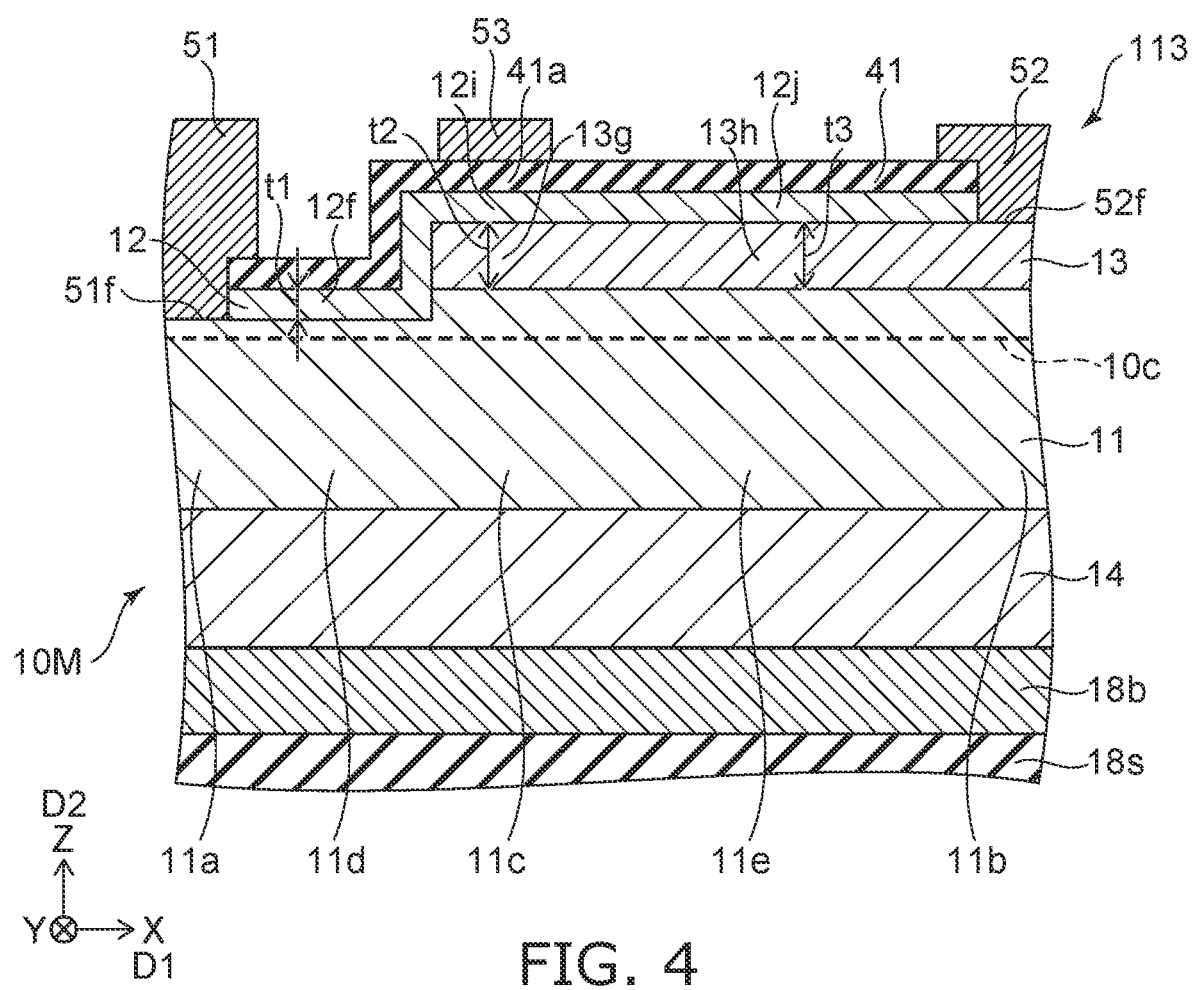
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, in a semiconductor device 113 according to the embodiment, a step is provided between the fourth partial region 11*d* and the third partial region 11*c*. Except for this, the configuration of the semiconductor device 113 may be the same as that of the semiconductor device 111.

In the semiconductor device 113, for example, the thickness of the fourth partial region 11*d* is thinner than the thickness of the third partial region 11*c*. These thicknesses are lengths along the second direction D2. For example, the direction from the sixth partial region 12*f* to a part of the third partial region 11*c* is along the first direction D1. The sixth partial region 12*f* faces the side face of the third partial region 11*c*, for example.

For example, in the manufacturing method described later, a part of a film serving as the third nitride region 13 may be removed, and the second nitride region 12 may be formed in the removed region. When removing a part of the film, a part of the first nitride region 11 may be removed. Thereby, the step may be provided between the fourth partial region 11*d* and the third partial region 11*c*. For example, a semiconductor device having good characteristics can be stably obtained under a wide range of manufacturing conditions.

Figure 5:
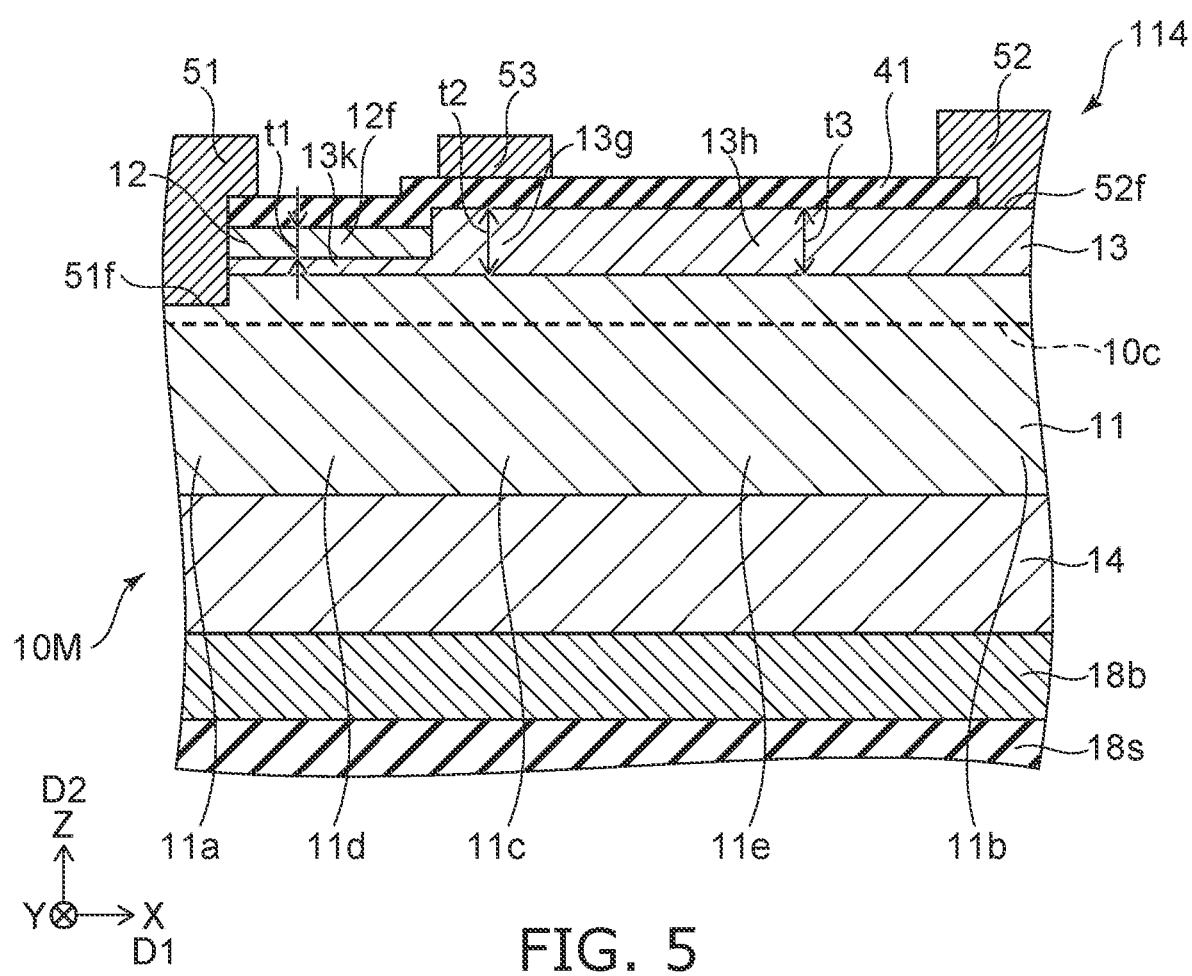
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 114 according to the embodiment, a part of the third nitride region 13 is provided between the fourth partial region 11*d* and the sixth partial region 12*f*. Except for this, the configuration of the semiconductor device 114 may be the same as that of the semiconductor device 110.

In the semiconductor device 114, the third nitride region 13 includes an eleventh partial region 13*k*. The eleventh partial region 13*k* is located between the fourth partial region 11*d* and the sixth partial region 12*f*. As described with respect to the semiconductor device 113, a part of the film serving as the third nitride region 13 may be removed. In the removing, a part of the film may remain. The remaining film corresponds to the eleventh partial region 13*k*. For example, a semiconductor device having good characteristics can be stably obtained under a wide range of manufacturing conditions.

Second Embodiment

In the second embodiment, the third electrode 53 is a p-type semiconductor.

Figure 6:
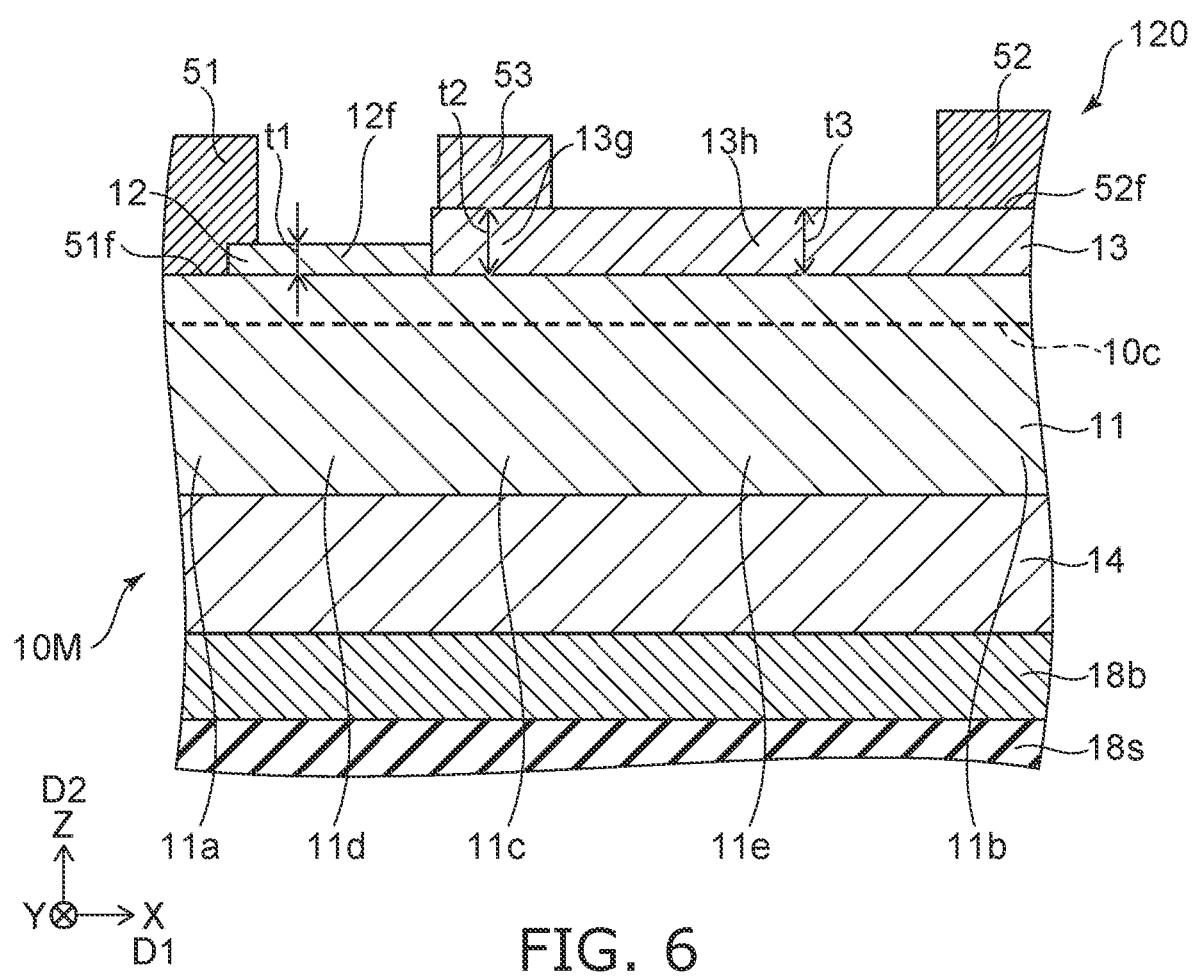
FIG. 6 is a schematic cross-sectional view illustrating a semiconductor device according to a second embodiment.

FIG. 6 is a schematic cross-sectional view illustrating a semiconductor device according to the second embodiment.

In a semiconductor device 120 according to the embodiment illustrated in FIG. 6, the third electrode 53 includes a p-type nitride. The p-type nitride includes nitrogen and at least one selected from the group consisting of Al and Ga. The third electrode 53 includes, for example, Mg. The third electrode 53 is in contact with the seventh partial region 13*g*. The configuration of the semiconductor device 120 other than the above may be the same as that of the semiconductor device 110, for example.

In the semiconductor device 120, the third electrode 53 includes, for example, p-type AlGaN or p-type GaN. For example, by such a simple configuration, the desired operation can be obtained. A normally-off operation is obtained.

Figure 7:
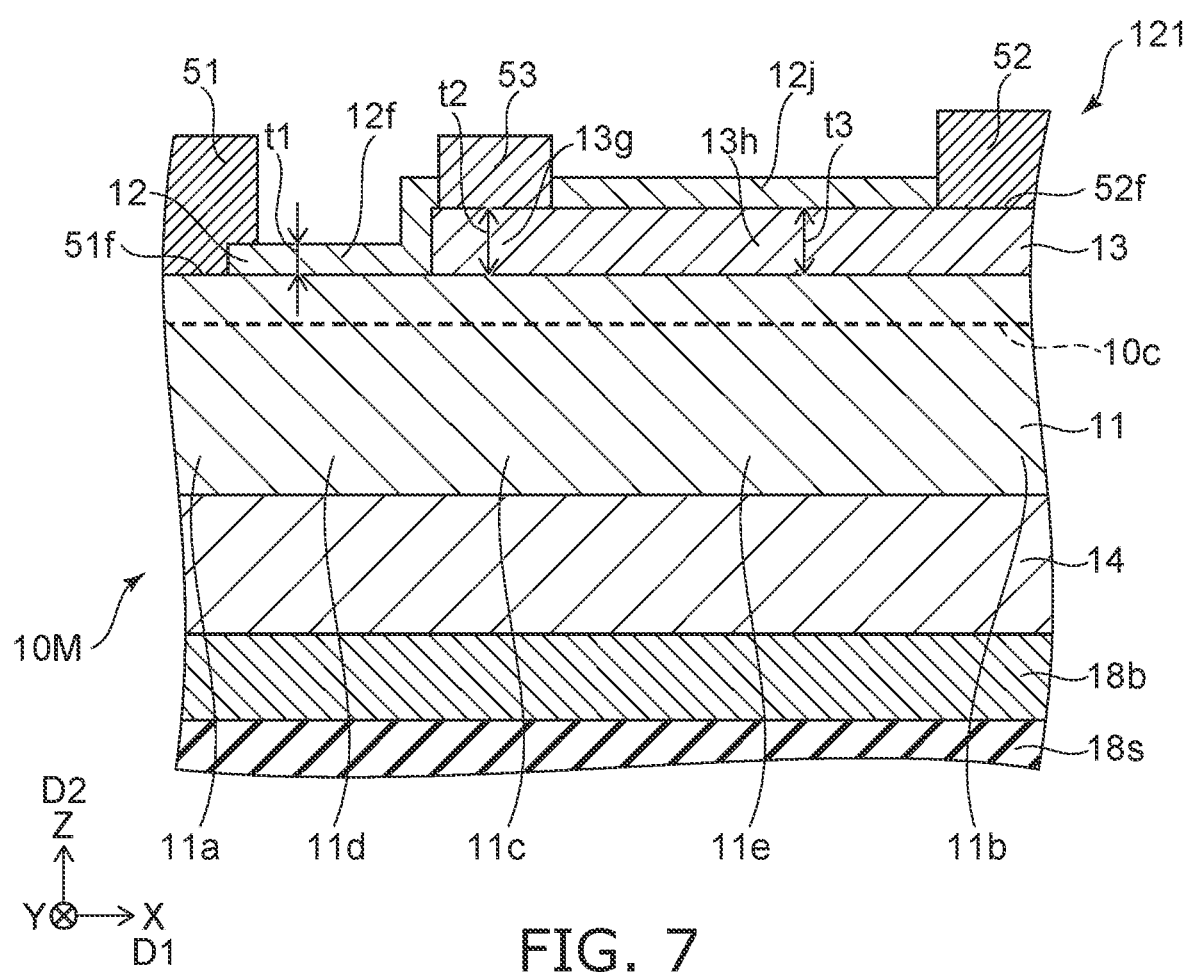
FIG. 7 is a schematic cross-sectional view illustrating a semiconductor device according to the second embodiment.

FIG. 7 is a schematic cross-sectional view illustrating a semiconductor device according to the second embodiment.

As shown in FIG. 7, in a semiconductor device 121 according to the embodiment, the second nitride region 12 further includes the tenth partial region 12*j*. The configuration of the semiconductor device 121 other than this may be the same as that of the semiconductor device 120, for example.

In the semiconductor device 121, the third nitride region 13 includes the eighth partial region 13*h*. The direction from the fifth partial region 11*e* to the eighth partial region 13*h* is along the second direction D2. The eighth partial region 13*h* is located between the fifth partial region 11*e* and the tenth partial region 12*j*. By providing the tenth partial region 12*j*, the eighth partial region 13*h* is protected.

Figure 8:
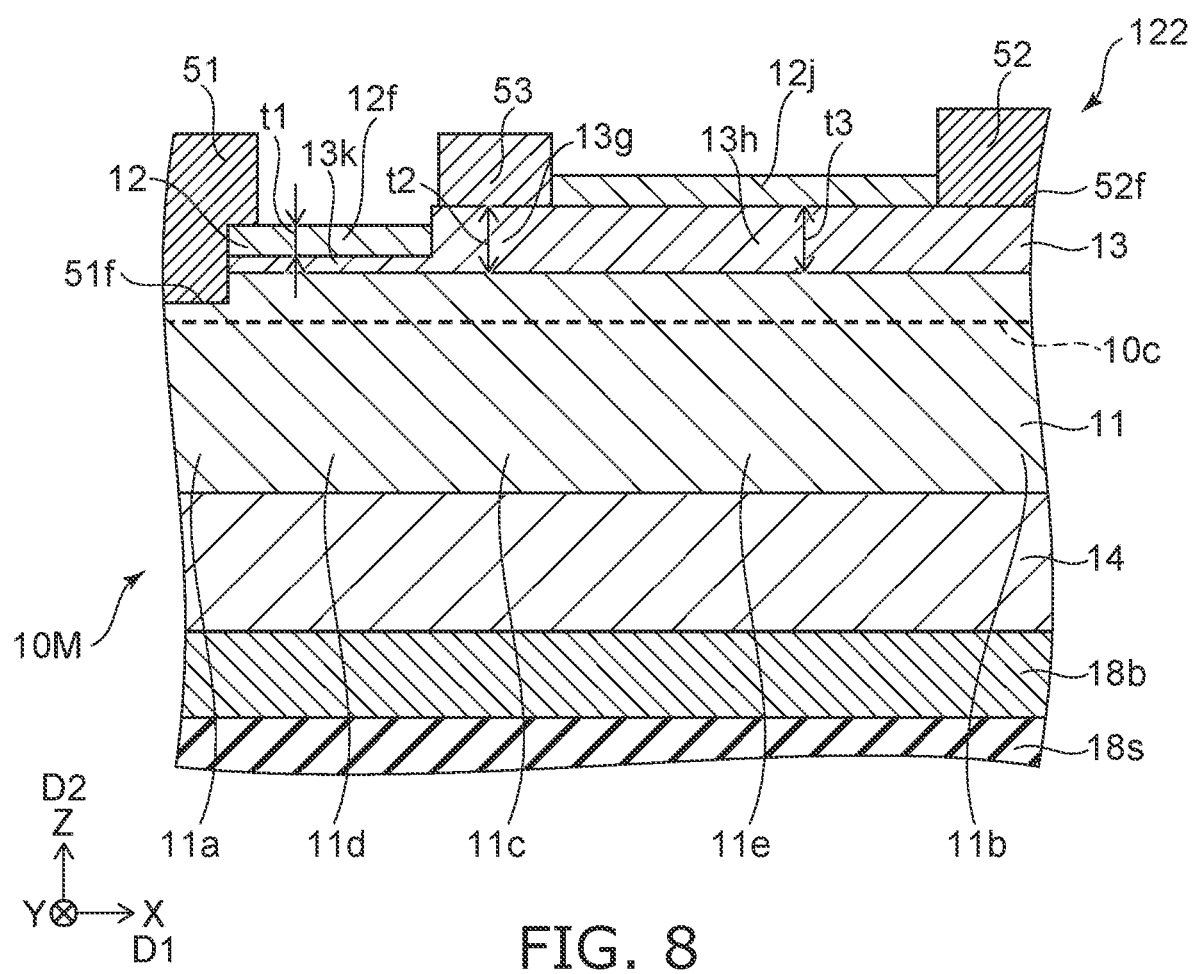
FIG. 8 is a schematic cross-sectional view illustrating a semiconductor device according to the second embodiment.

FIG. 8 is a schematic cross-sectional view illustrating a semiconductor device according to the second embodiment.

As shown in FIG. 8, in a semiconductor device 122 according to the embodiment, the third nitride region 13 includes the eleventh partial region 13*k*. The configuration of the semiconductor device 122 other than this may be the same as that of the semiconductor device 121, for example.

In the semiconductor device 122, the eleventh partial region 13*k* is located between the fourth partial region 11*d* and the sixth partial region 12*f*. For example, a part of the film served as the third nitride region 13 may be removed. In the removing, a part of the film may remain. The remaining film corresponds to the eleventh partial region 13*k*. For example, a semiconductor device having good characteristics can be stably obtained under a wide range of manufacturing conditions.

An example of a method of manufacturing the semiconductor device according to the embodiment will be described below. An example of the method of manufacturing the semiconductor device 113 will be described below.

FIGS. 9A to 9D and FIGS. 10A to 10C are schematic cross-sectional views illustrating a method of manufacturing the semiconductor device according to the embodiment.

Figure 9A:
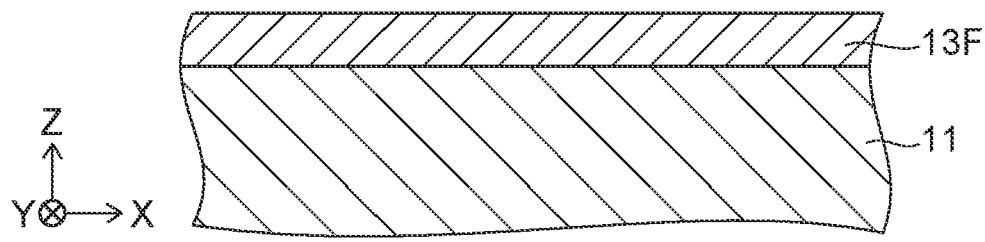
FIGS. 9A to 9D are schematic cross-sectional views illustrating a method of manufacturing the semiconductor device according to the embodiment.

As shown in FIG. 9A, a third nitride film 13F serving as the third nitride region 13 is formed on the first nitride region 11.

Figure 9B:
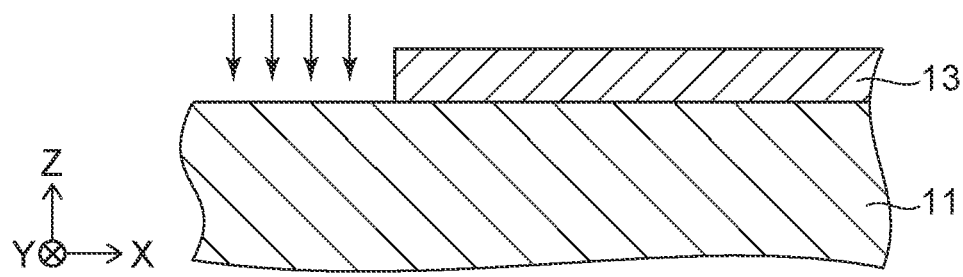

As shown in FIG. 9B, a part of the third nitride film 13F is removed. The removing may be performed, for example, by a dry etching using chlorine-based gas. In the etching, a part of the first nitride region 11 may be removed.

Figure 9C:
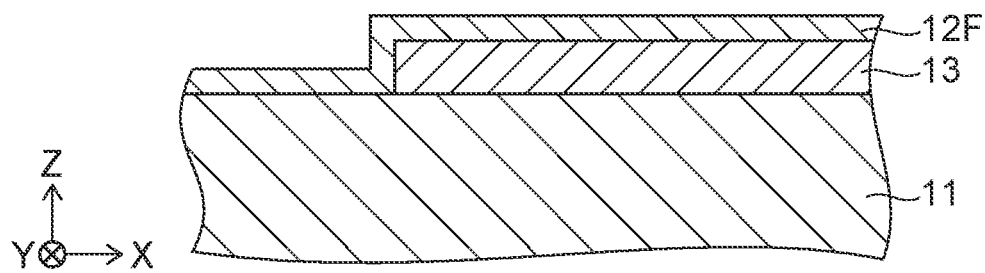

As shown in FIG. 9C, a second nitride film 12F serving as the second nitride region 12 is formed. The second nitride film 12F may be formed by, for example, an epitaxial growth.

Figure 9D:
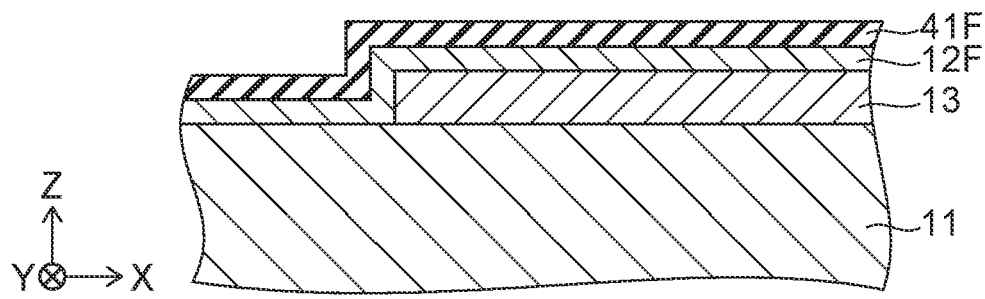
Figure 10A:
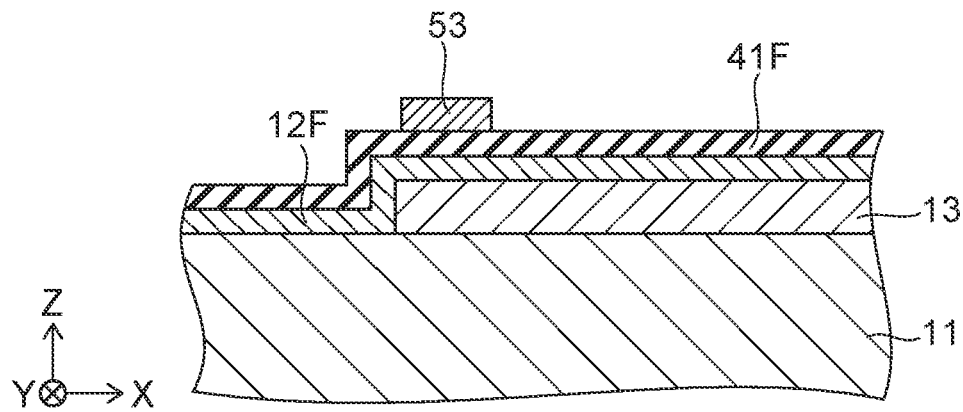
FIGS. 10A to 10C are schematic cross-sectional views illustrating the method of manufacturing the semiconductor device according to the embodiment.

As shown in FIG. 9D, a first insulating film 41F serving as the first insulating member 41 is formed. As shown in FIG. 10A, the third electrode 53 is formed.

Figure 10B:
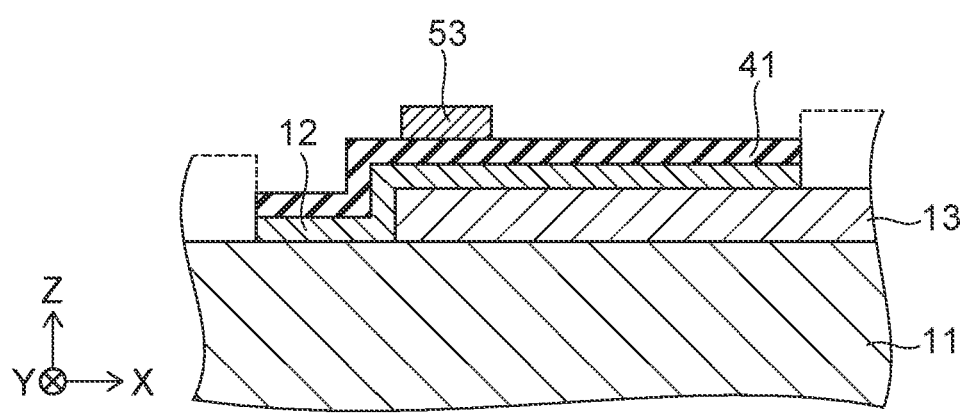

As shown in FIG. 10B, the second nitride film 12F and the first insulating film 41F in the region where the first electrode 51 and the second electrode 52 are formed are removed. Thereby the second nitride region 12 and the first insulating member 41 are obtained.

Figure 10C:
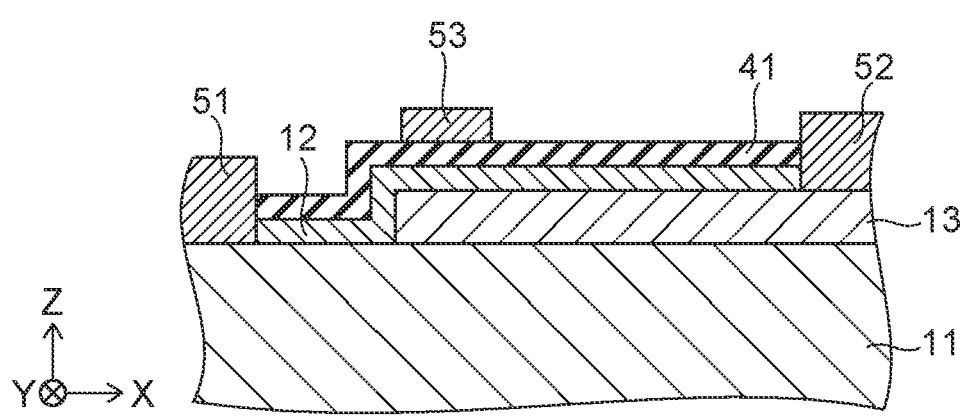

As shown in FIG. 10C, the first electrode 51 and the second electrode 52 are formed. Thus, the semiconductor device 113 is obtained.

In the embodiment, at least one of the first electrode 51 or the second electrode 52 includes at least one selected from the group consisting of, for example, aluminum, titanium, nickel, and gold. The third electrode 53 includes at least one selected from the group consisting of, for example, TiN, WN, Ni, Au, Pt, and Ti. The third electrode 53 may include, for example, conductive silicon or polysilicon. The third electrode 53 may include, for example, conductive GaN. The third electrode 53 may include, for example, poly GaN or poly AlGaN.

Information on the length and the thickness can be obtained by an electron microscopy. Information about the composition of the material can be obtained by a SIMS (Secondary Ion Mass Spectrometry) or an EDX (Energy dispersive X-ray spectroscopy).

Embodiments may include the following configurations (e.g., a technical proposals).

Configuration 1

A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first nitride region including $Al_{x1}Ga_{1-x1}N$ ($0 \le x1 < 1$), the first nitride region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, and a position of the fifth partial region in the first direction being between the position of the third partial region in the first direction and a position of the second partial region in the first direction;
a second nitride region including $Al_{x2}Ga_{1-x2}N$ ($x1 < x2 \le 1$) or $In_yAl_zGa_{(1-y-z)}N$ ($0 < y \le 1$, $0 \le z < 1$, $y+z \le 1$), the second nitride region including a sixth partial region, a direction from the fourth partial region to the sixth partial region being along the second direction; and
a third nitride region including $Al_{x3}Ga_{1-x3}N$ ($x1 < x3 < x2$), the third nitride region including a seventh partial region, the seventh partial region being located between the third partial region and the third electrode.

Configuration 2

The semiconductor device according to Configuration 1, wherein
the sixth partial region has a first thickness along the second direction,
the seventh partial region has a second thickness along the second direction, and
the first thickness is thinner than the second thickness.

Configuration 3

The semiconductor device according to Configuration 2, wherein
the third nitride region further includes an eighth partial region, and
a direction from the fifth partial region to the eighth partial region is along the second direction.

Configuration 4

The semiconductor device according to Configuration 3, wherein
the sixth partial region has a first thickness along the second direction,
the seventh partial region has a second thickness along the second direction,
the eighth partial region has a third thickness along the second direction,
the first thickness is thinner than the second thickness, and
the first thickness is thinner than the third thickness.

Configuration 5

The semiconductor device according to Configuration 3 or 4, wherein
the second nitride region further includes a ninth partial region, and
the ninth partial region is located between the seventh partial region and the third electrode.

Configuration 6

The semiconductor device according to Configuration 5, wherein
the second nitride region further includes a tenth partial region, and
the eighth partial region is located between the fifth partial region and the tenth partial region.

Configuration 7

The semiconductor device according to Configuration 6, wherein
the tenth partial region is amorphous, or
a crystallinity in the sixth partial region is higher than a crystallinity in the tenth partial region.

Configuration 8

The semiconductor device according to Configuration 7, wherein further comprising a first insulating layer,
the first insulating layer being located between the eighth partial region and the tenth partial region.

Configuration 9

The semiconductor device according to any one of Configurations 1 to 8, wherein
a direction from the sixth partial region to a part of the third partial region is along the first direction.

Configuration 10

The semiconductor device according to any one of Configurations 1 to 8, wherein
the third nitride region includes an eleventh partial region, and
the eleventh partial region is located between the fourth partial region and the sixth partial region.

Configuration 11

The semiconductor device according to any one of Configurations 1 to 10, further comprising a first insulating member including a first insulating region, the first insulating region being located between the third partial region and the third electrode.

Configuration 12

The semiconductor device according to Configuration 11, wherein the sixth partial region is located between the fourth partial region and a part of the first insulating member.

Configuration 13

The semiconductor device according to Configuration 1 or 2, wherein
the third electrode includes a p-type nitride,
the p-type nitride includes at least one selected from the group consisting of Al and Ga and nitrogen.

Configuration 14

The semiconductor device according to Configuration 13, wherein the third electrode is in contact with the seventh partial region.

Configuration 15

The semiconductor device according to Configuration 13, wherein
the third nitride region further includes an eighth partial region,
a direction from the fifth partial region to the eighth partial region is along the second direction, and
the second nitride region further includes a tenth partial region, and
the eighth partial region is located between the fifth partial region and the tenth partial region.

Configuration 16

The semiconductor device according to Configuration 13, wherein the third nitride region includes an eleventh partial region,
the eleventh partial region is located between the fourth partial region and the sixth partial region.

Configuration 17

The semiconductor device according to any one of Configurations 1 to 16, wherein
the second nitride region includes the $Al_{x2}Ga_{1-x2}N$ (x1<x2≤1),
the x2 is not less than 0.8 and not more than 1, and
the x3 is not less than 0.1 and not more than 0.35.

Configuration 18

The semiconductor device according to Configuration 2, wherein the first thickness is 0.5 times or less of the second thickness.

Configuration 19

The semiconductor device according to Configuration 2, wherein
the first thickness is not less than 1 nm and not more than nm, and the second thickness is not less than 20 nm and not more than 40 nm.

Configuration 20

The semiconductor device according to any one of Configurations 1 to 19, wherein
the first electrode includes a first electrode face,
a direction from the first partial region to the first electrode face is along the second direction,
the second electrode includes a second electrode face,
a direction from the second partial region to the second electrode face is along the second direction, and
a distance in the second direction between a position of the first electrode face in the second direction and a position of the second electrode face in the second direction is 50 nm or less.

According to the embodiment, a semiconductor device capable of improving characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, nitride members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention are included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first electrode;
a second electrode, a direction from the first electrode to the second electrode being along a first direction;
a third electrode, a position of the third electrode in the first direction being between a position of the first electrode in the first direction and a position of the second electrode in the first direction;
a first nitride region including $Al_{x1}Ga_{1-x1}N$ (0≤x1<1), the first nitride region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, and a position of the fifth partial region in the first direction being between the position of the third partial region in the first direction and a position of the second partial region in the first direction;

a second nitride region including $Al_{x2}Ga_{1-x2}N$ (x1<x2≤1), the second nitride region including a sixth partial region, a direction from the fourth partial region to the sixth partial region being along the second direction; and a third nitride region including $Al_{x3}Ga_{1-x3}N$ (x1<x3<x2), the third nitride region including a seventh partial region, the seventh partial region being located between the third partial region and the third electrode, wherein the first nitride region directly contacts the second nitride region and the third nitride region, the sixth partial region has a first thickness along the second direction;

the seventh partial region has a second thickness along the second direction; and the first thickness is thinner than the second thickness.

2. The semiconductor device according to claim 1, wherein:

the third nitride region further includes an eighth partial region; and a direction from the fifth partial region to the eighth partial region is along the second direction.

3. The semiconductor device according to claim 1, wherein:

the first thickness is not less than 1 nm and not more than 10 nm; and the second thickness is not less than 20 nm and not more than 40 nm.

4. A semiconductor device, comprising:

a first electrode;

a second electrode, a direction from the first electrode to the second electrode being along a first direction;

a third electrode, a position of the third electrode in the first direction being between a position of the first electrode in the first direction and a position of the second electrode in the first direction;

a first nitride region including $Al_{x1}Ga_{1-x1}N$ (0≤x1<1), the first nitride region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, a position of the fourth partial region in the first direction being between a position of the first partial region in the first direction and a position of the third partial region in the first direction, and a position of the fifth partial region in the first direction being between the position of the third partial region in the first direction and a position of the second partial region in the first direction;

a second nitride region including $Al_{x2}Ga_{1-x2}N$ (x1<x2≤1), the second nitride region including a sixth partial region, a direction from the fourth partial region to the sixth partial region being along the second direction; and a third nitride region including $Al_{x3}Ga_{1-x3}N$ (x1<x3<x2), the third nitride region including a seventh partial region, the seventh partial region being located between the third partial region and the third electrode, wherein the sixth partial region has a first thickness along the second direction, the seventh partial region has a second thickness along the second direction, the first thickness is thinner than the second thickness, the third nitride region further includes an eighth partial region, a direction from the fifth partial region to the eighth partial region is along the second direction, the second nitride region further includes a ninth partial region, the ninth partial region is located between the seventh partial region and the third electrode, the second nitride region further includes a tenth partial region, the eighth partial region is located between the fifth partial region and the tenth partial region, and wherein:

the tenth partial region is amorphous, or a crystallinity in the sixth partial region is higher than a crystallinity in the tenth partial region.

5. The semiconductor device according to claim 4, wherein:

the eighth partial region has a third thickness along the second direction, and the first thickness is thinner than the third thickness.

6. The semiconductor device according to claim 4, further comprising a first insulating layer, the first insulating layer being located between the eighth partial region and the tenth partial region.

7. The semiconductor device according to claim 4, wherein a direction from the sixth partial region to a part of the third partial region is along the first direction.

8. The semiconductor device according to claim 4, further comprising a first insulating member including a first insulating region, the first insulating region being located between the third partial region and the third electrode.

9. The semiconductor device according to claim 8, wherein the sixth partial region is located between the fourth partial region and a part of the first insulating member.

10. The semiconductor device according to claim 4, wherein:

the third electrode includes a p-type nitride; and the p-type nitride includes at least one selected from the group consisting of Al and Ga and nitrogen.

11. The semiconductor device according to claim 4, wherein:

the second nitride region includes the $Al_{x2}Ga_{1-x2}N$ (x1<x2≤1);

the x2 is not less than 0.8 and not more than 1; and the x3 is not less than 0.1 and not more than 0.35.

12. The semiconductor device according to claim 4, wherein the first thickness is 0.5 times or less of the second thickness.

13. The semiconductor device according to claim 4, wherein:
- the first electrode includes a first electrode face;
- a direction from the first partial region to the first electrode face is along the second direction;
- the second electrode includes a second electrode face;
- a direction from the second partial region to the second electrode face is along the second direction; and
- a distance in the second direction between a position of the first electrode face in the second direction and a position of the second electrode face in the second direction is 50 nm or less.

* * * * *